United States Patent
Thain et al.

(10) Patent No.: US 9,755,316 B2
(45) Date of Patent: Sep. 5, 2017

(54) DIFFRACTION DEVICE INTENDED TO BE FIXED ONTO THE OUTER FACE OF A WALL

(71) Applicant: Airbus Operations (SAS), Toulouse (FR)

(72) Inventors: Andrew Thain, L'Isle Jourdain (FR); Anass Jaber, Toulouse (FR)

(73) Assignee: AIRBUS OPERATIONS SAS, Toulouse (FR)

( * ) Notice: Subject to any disclaimer, the term of this patent is extended or adjusted under 35 U.S.C. 154(b) by 156 days.

(21) Appl. No.: 14/661,200

(22) Filed: Mar. 18, 2015

(65) Prior Publication Data

US 2015/0270621 A1 Sep. 24, 2015

(30) Foreign Application Priority Data

Mar. 19, 2014 (FR) ...................................... 14 52273

(51) Int. Cl.
*H01Q 15/00* (2006.01)
*H05K 9/00* (2006.01)
(Continued)

(52) U.S. Cl.
CPC ..... *H01Q 15/0006* (2013.01); *E04F 13/0871* (2013.01); *H01Q 1/422* (2013.01);
(Continued)

(58) Field of Classification Search
CPC .. H01Q 15/0006; H01Q 15/145; H01Q 1/528; H01Q 1/422; H01Q 15/14; H05K 9/0001; H05K 9/0052; E04F 13/0871
See application file for complete search history.

(56) References Cited

U.S. PATENT DOCUMENTS 3,538,663 A * 11/1970 MacLeod .................. E04B 2/96
52/309.11
3,605,365 A * 9/1971 Hastings .................. E04B 1/35
264/45.3
(Continued)

FOREIGN PATENT DOCUMENTS

FR 2983577 6/2013
FR 2983578 6/2013
(Continued)

OTHER PUBLICATIONS

French Search Report, Dec. 17, 2014.

*Primary Examiner* — Brent W Herring
(74) *Attorney, Agent, or Firm* — Greer, Burns & Crain, Ltd.

(57) ABSTRACT

An electromagnetic wave diffraction device for fixing onto an outer wall face comprising a plurality of electrically conductive resonant elements having an L-shaped profile fixed parallel on the outer face. Each element comprises a first and second wall secured at right angles to one another along a common edge. The first wall is fixed at a right angle to the outer face by a fixing edge parallel to the common edge. The second wall has a free edge parallel to the common edge. The free edges of all elements are parallel and arranged on the same side relative to the common edge of the corresponding element. A weather protection arrangement for reinforcing the protection of a capacitive area generated in a space between the outer face and the second wall, in the form of a water impermeable dielectric material panel, is fixed to the outer face and covers the elements.

16 Claims, 3 Drawing Sheets

(51) Int. Cl.
*E04F 13/08* (2006.01)
*H01Q 15/14* (2006.01)
*H01Q 1/42* (2006.01)
*H01Q 1/52* (2006.01)

(52) U.S. Cl.
CPC ............ *H01Q 1/528* (2013.01); *H01Q 15/14* (2013.01); *H01Q 15/145* (2013.01); *H05K 9/0001* (2013.01)

(56) References Cited

U.S. PATENT DOCUMENTS

| | | | | |
|---|---|---|---|---|
| 4,118,704 A * | 10/1978 | Ishino | ................... | H01Q 17/008 342/4 |
| 5,057,842 A * | 10/1991 | Moller | ................... | H01Q 15/14 342/1 |
| 5,060,426 A * | 10/1991 | Jantzen | ................... | E04B 1/344 52/126.1 |
| 5,204,680 A * | 4/1993 | Allington | ............... | H01Q 15/14 342/4 |
| 5,286,318 A * | 2/1994 | Sims | ....................... | E04D 11/02 156/71 |
| 5,353,029 A * | 10/1994 | Johnston | ................ | H01Q 17/00 342/1 |
| 5,853,889 A * | 12/1998 | Joshi | ......................... | E04B 1/92 252/62.64 |
| 6,419,772 B1 * | 7/2002 | Takamatsu | ............... | H01Q 1/12 156/71 |
| 7,755,829 B2 * | 7/2010 | Powers | ..................... | E06B 9/24 359/227 |
| 8,169,685 B2 * | 5/2012 | Powers | .................... | E06B 9/24 359/227 |
| 8,621,812 B2 * | 1/2014 | Holt | ...................... | E04B 1/7629 52/506.01 |
| 9,260,865 B2 * | 2/2016 | Rothwell | ................. | E04C 2/205 |
| 9,507,063 B2 * | 11/2016 | Thain | ................... | H05K 9/0001 |
| 2012/0299787 A1 | 11/2012 | Sakurai et al. | | |
| 2013/0091797 A1 * | 4/2013 | Holt | ...................... | E04B 1/7629 52/512 |
| 2013/0293323 A1 | 11/2013 | Nakase | | |
| 2014/0320964 A1 | 10/2014 | Thain et al. | | |

FOREIGN PATENT DOCUMENTS

JP 2012175422 9/2012
WO 2008127196 10/2008

* cited by examiner

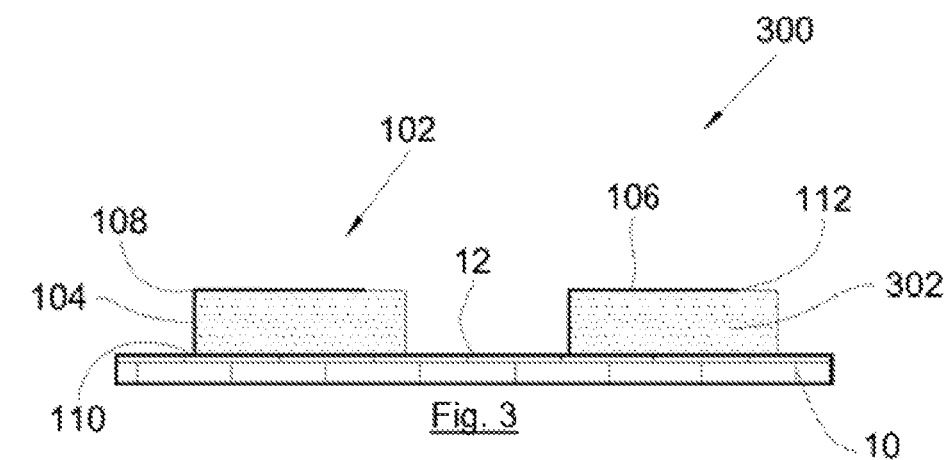
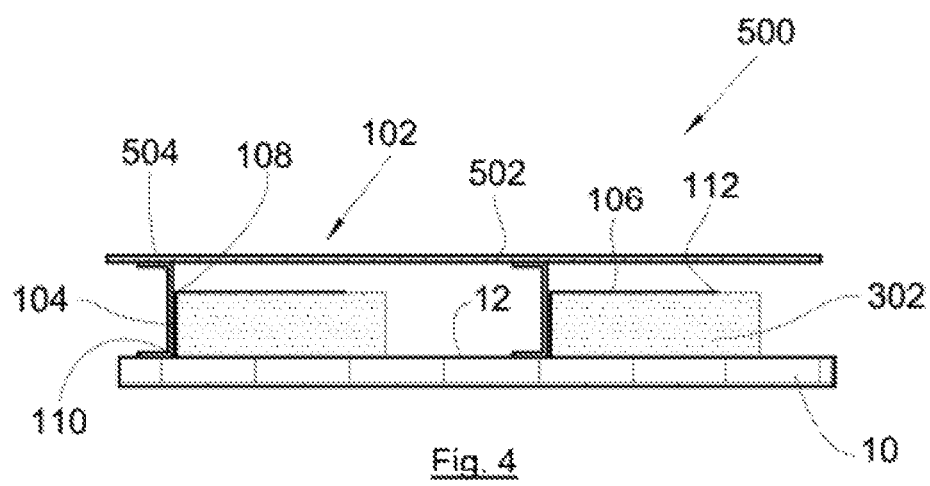
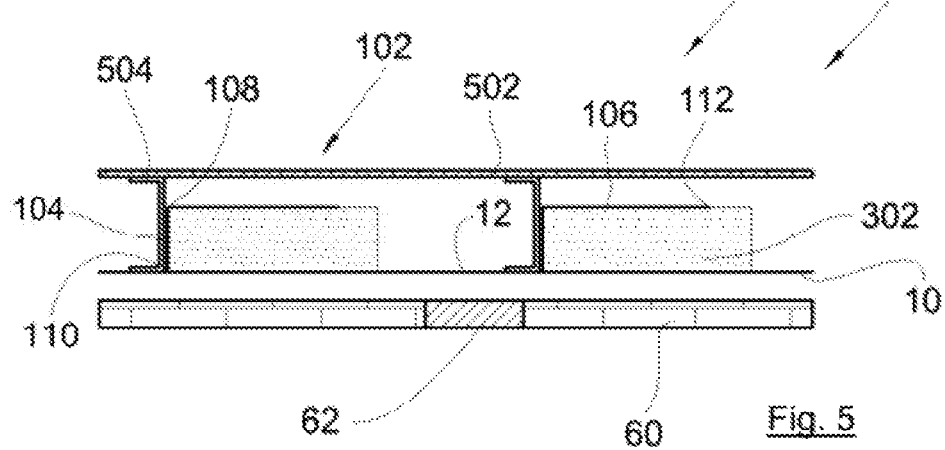

DIFFRACTION DEVICE INTENDED TO BE FIXED ONTO THE OUTER FACE OF A WALL

CROSS-REFERENCES TO RELATED APPLICATIONS

This application claims the benefit of the French patent application No. 1452273 filed on Mar. 19, 2014, the entire disclosures of which are incorporated herein by way of reference.

BACKGROUND OF THE INVENTION

The present invention relates to an electromagnetic wave diffraction device which is intended to equip an electrically conductive wall or an electrically conductive outer wall of a building, an electrically conductive wall equipped with such a device, and a building equipped with such a diffraction device or such an equipped wall.

The invention relates to the general field of the reflection of electromagnetic waves, radio waves in particular, and more particularly to that of the prevention of the effects of the radiofrequency waves reflected by structures such as building frontages on the space surrounding such structures. The invention is applied more particularly in an airport area in order to prevent disturbances from disrupting the radiofrequency measurement systems.

Because of the presence of numerous radiofrequency sources, notably the ILS antennas themselves, the problem of stray reflections by the buildings is a significant problem, the solving of which generally involves preparing a layout plan made up of areas, notably the areas relatively close to the runways where it is prohibited to place any construction of the slightest size. Now, given, notably, the urban concentration and the desire to place airport areas at relatively short distances from the urban areas, it is becoming increasingly necessary to maximize the rate of occupancy of the airport areas in terms of surface. Consequently, finding a solution to the problems of stray reflections of radiofrequency signals in sensitive directions appears more than ever topical.

The document FR-A-2 983 577 describes a diffraction device which comprises a plurality of conductive tubular resonant elements which are arranged periodically and parallel on an outer wall of a building.

The section of each tubular element takes the form of a rectangle of which one face is fixed onto the outer wall of the building, two wings, each secured to one of the ends of the face and at right angles to the face, and two fins, each secured to one of the wings and parallel to the face and the free ends of which are separated by a slot. The capacitance is then formed by the slot.

This slot is oriented outwards and is therefore subject to bad weather. When it rains, the slot and the fins which delimit it are in contact with the water. Since water can be polarized, the capacitance of the diffraction device is increased and its effectiveness is reduced.

SUMMARY OF THE INVENTION

One object of the present invention is to propose an electromagnetic wave diffraction device which does not have the drawbacks of the prior art and which in particular makes it possible to avoid having the characteristics of said device modified under the action of outside elements such as water.

To this end, an electromagnetic wave diffraction device is proposed that is intended to be fixed onto an outer face of an electrically conductively wall, the diffraction device comprising:

a plurality of resonant elements in the form of an L-shaped profile which are electrically conductive and fixed parallel on the outer face, each resonant element, comprising a first wall and a second wall secured at right angles to one another along a common edge, the first wall being intended to be fixed at right angles to the outer face by a fixing edge parallel to the common edge, whereas the edge of the second wall which is parallel to the common edge constitutes a free edge, and where the free edges of all the resonant elements are parallel and arranged on the same side relative to the common edge of the corresponding resonant element, and a protection means or protection arrangement intended to reinforce the protection of a capacitive area generated in a space between the outer face and the second wall, against weather attack and taking the form of a panel produced with a dielectric material that is impermeable to water, fixed to the outer face and covering the plurality of resonant elements.

Such an electromagnetic wave diffraction device therefore makes it possible to protect the capacitance generated between the outer face and the second wall of each of the resonant elements from bad weather.

The length of the first wall and the length of the second wall of each of the resonant elements of the diffraction device according to the invention are defined as a function of a wavelength and of an angle of incidence of an incident radiofrequency wave to be diffracted.

In one embodiment of the diffraction device according to the invention, a block produced with a dielectric material that is impermeable to water is housed between the outer face and the second wall so as to fill the internal volume of the L-shaped resonant element.

Preferentially, at least a part of said panel is transparent in the visible spectrum.

According to yet another variant embodiment of the diffraction device, the resonant elements are made of a material that is transparent in the visible spectrum.

A second object of the invention relates to a building comprising an electrically conductive outer wall having an outer face and an electromagnetic wave diffraction device according to the invention in which each resonant element is fixed onto said outer face.

A third object of the invention is an equipped wall comprising an electrically conductive wall having an outer face and intended to be fixed onto an outer wall of a building and an electromagnetic wave diffraction device according to the invention, in which each resonant element is fixed onto said outer face.

According to a variant embodiment of the third object of the invention, at least a part of the equipped wall is transparent in the visible spectrum, particularly between 400 nm and 700 nm.

A fourth object of the invention is a building comprising an outer wall and an equipped wall according to the invention, in which said equipped wall is fixed onto the outer wall.

The invention relates also to a building comprising:

an outer wall having an outer face and a plurality of apertures arranged horizontally to one another, thus defining, on the outer face below the horizontal alignment of apertures, a lower surface and, above the horizontal alignment of apertures, an upper surface, for each lower surface and each upper surface, a diffraction device according to one of the preceding variants fixed to each lower surface and to each upper surface, and each part of the outer face which is not covered by the diffraction devices or pierced with the apertures is covered with a coating absorbing the radar waves.

The invention relates also to a building comprising:

an outer wall having an outer face and a plurality of apertures arranged vertically to one another, thus defining, on the outer face to the left of each vertical alignment of apertures, a left lateral surface and, to the right of each vertical alignment of apertures, a right lateral surface, for each left lateral surface and each right lateral surface, a diffraction device according to one of the preceding variants fixed to each left lateral surface and each right lateral surface, and each part of the outer face which is not covered by the diffraction devices or pierced with the apertures is covered with a coating absorbing the radar waves.

BRIEF DESCRIPTION OF THE DRAWINGS

The features of the invention mentioned above, and others, will become more clearly apparent on reading the following description of an exemplary embodiment, said description being made in relation to the attached drawings, in which:

FIG. 3 is a schematic representation of an electromagnetic wave diffraction device, FIG. 4 is a schematic representation of an electromagnetic wave diffraction device according to the invention, FIG. 5 is a schematic representation of an equipped wall according to the invention.

DETAILED DESCRIPTION OF THE PREFERRED EMBODIMENTS

Figures 1, 2:
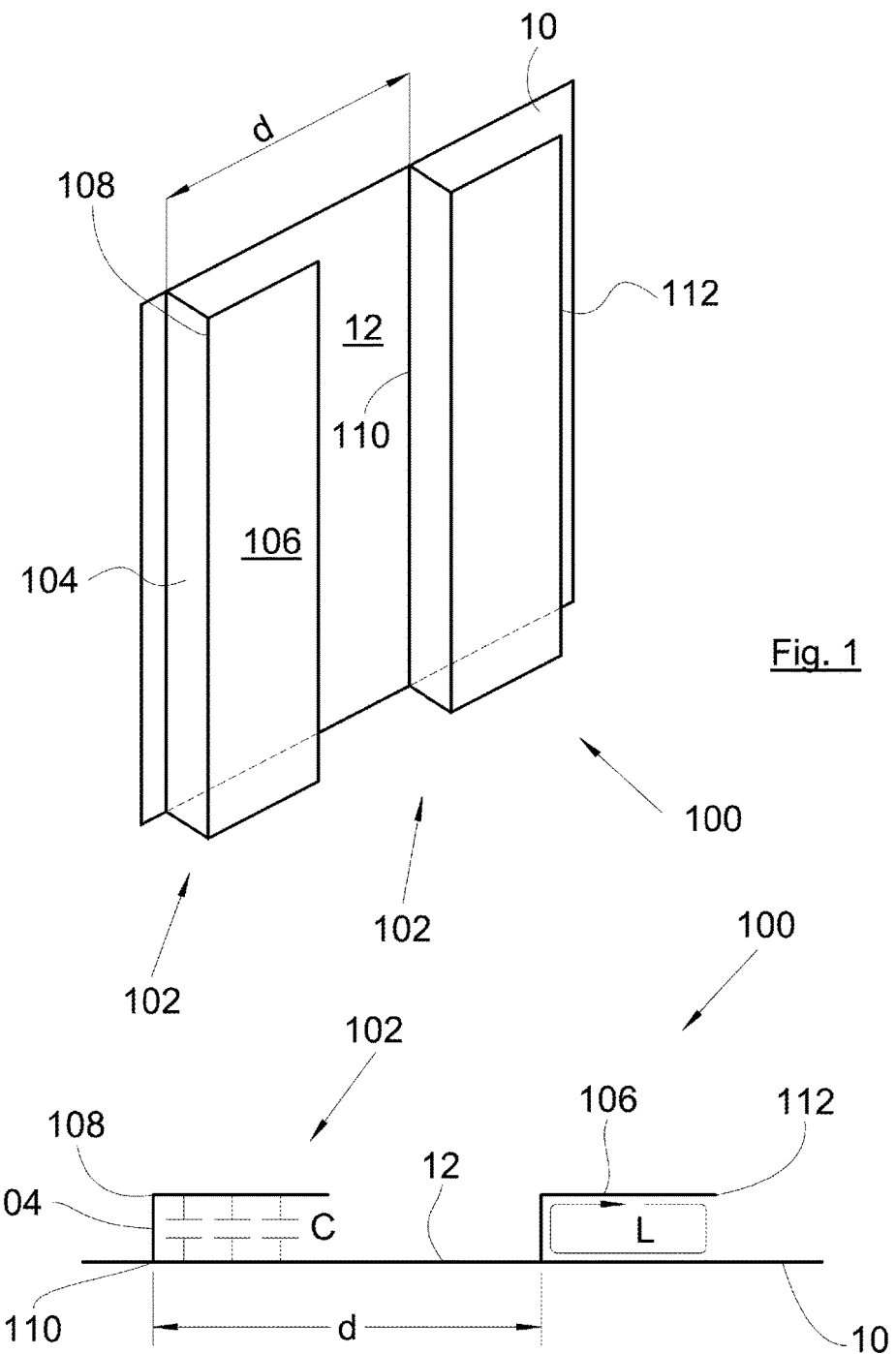
FIG. 1 is a schematic representation of an outer wall of a building equipped with an electromagnetic wave diffraction device.
FIG. 2 is a schematic representation of the functioning principle of an electromagnetic wave diffraction device.

FIG. 1 shows an electrically conductive and reflecting wall 10 which has an outer face 12 which is oriented outward and on which is arranged an electromagnetic wave diffraction device 100.

The wall 10 can be electrically conductive by virtue of its constituent material or by virtue of the application of an electrically conductive coating (for example a paint) on it.

The diffraction device 100 comprises a plurality of resonant elements 102 which are fixed periodically and parallel to one another onto the outer face 12 and the length of which depends on the dimensions of the outer face 12 to be covered.

Each resonant element 102 is produced in an electrically conducive material and takes the form of an L-shaped profile.

Preferentially, each resonant element 102 is produced in Aluconbond® which is manufactured by the company 3A Composites and which consists of a strip of plastic sandwiched between two aluminum sheets.

The resonant elements 102 are arranged on the outer face 12 so as to form a diffraction grating exhibiting a pitch "d" which is determined as a function of the wavelength λ, and of the angle of incidence θ of the incident electromagnetic waves so as to create a diffraction grating producing a phase-shift of the reflected wave in a specular direction.

Depending on whether the source of the radiofrequency emission received by the outer face 12 is considered to be a far source or not, the pitch "d" is constant or varies as a function of the local angle of incidence of the electromagnetic wave.

The resonant element 102 comprises a first wall 104 and a second wall 106 which are secured at right angles to one another along a common edge 108. The first wall 104 and the second wall 106 are here rectangular.

The first wall 104 is fixed at right angles to the outer face 12 by a fixing edge 110 distinct from and parallel to the common edge 108.

The edge of the second wall 106 which is distinct from and parallel to the common edge 108 constitutes a free edge 112.

Thus, the first wall 104 is at right angles to the outer face 12 and the second wall 106 is parallel to the outer face 12.

All the resonant elements 102 are oriented in the same direction, that is to say that all the free edges 112 are parallel and arranged on the same side relative to the common edge 108 of the corresponding resonant element 102.

The resonant elements 102 are arranged on the outer face 12 so as to be oriented in a direction substantially at right angles to the plane defined by the propagation vectors of the incident and reflected waves. Thus, in the precise case of an outer wall of a building, the resonant elements 102 are arranged vertically.

FIG. 2 shows the principle of operation of the invention. Each resonant element 102 forms a circuit of resonance R—inductance L—capacitance C.

The left hand part of FIG. 2 shows that the capacitance C is generated in a space between the outer face 12 and the second wall 106. This space is called capacitive area and the capacitance that is thus created inside the resonant element 102 is away from the rain.

The right-hand part of FIG. 2 shows that the inductance L is formed by the first wall 104, the second wall 106 and the outer face 12 and is a function of the internal area of the L-shaped profile.

The dimensions of the resonant elements 102 are determined in such a way that the values of the inductance L and of the capacitance C make it possible to produce an equivalent resonant circuit having a resonance frequency F0 and a pass band ΔF0 defined by the relationship:

$$F_0 = \frac{1}{2\pi} \frac{1}{\sqrt{LC}}, \text{ and}$$

$$\frac{\Delta F}{F_0} = \frac{1}{R}\sqrt{\frac{L}{C}}.$$

Each resonant element 102 is dimensioned in such a way that, when it is illuminated by an incident radiofrequency wave from an emission source in a direction of incidence, the resonant element 102 produces a radiofrequency wave of the same frequency but affected by a given phase shift, such that the waves reflected by the different resonant elements 102 and the waves directly reflected by portions of the outer face 12 situated between these resonant elements 102 cancel one another in the specular direction. All of the incident radiofrequency wave is thus reflected toward the emission source in the direction of incidence.

Furthermore, such a construction means that the value of the capacitance is less sensitive to the manufacturing imperfections than in the case of the diffraction device of the prior art.

Furthermore, the quantity of conductive material which is used is less than in the case of the diffraction device of the prior art, and the resonant elements 102 are particularly easy to install without it being necessary to provide structural reinforcements. Furthermore, this reduction in the quantity of conductive material also makes it possible to reduce the cost of the device.

The length of the first wall 104 and the length of the second wall 106 are defined as a function of the wavelength and of the angle of incidence of the incident radiofrequency wave to be diffracted.

According to a particular embodiment, the signal emitted by an antenna of an ILS landing system is diffracted when the length of the second wall 106 is of the order of 60 cm±4 mm. Such a tolerance is greater than the tolerance allowed in the case of the diffraction device of the prior art.

More particularly, in the case of FIGS. 3 and 4, the wall 10 is the electrically conductive outer wall of a building, for example a hangar made of sheet metal or a wall covered with an electrically conductive coating, but the wall 10 can also be an additional wall fixed onto an outer wall of a building.

FIG. 3 shows an electromagnetic wave diffraction device 300.

If the support of the wall 10 does not make it possible to support the diffraction device 100, a block 302 is housed between the outer face 12 and the second wall 106 so as to fill the internal volume of the L. The block 302 is produced with a dielectric material that is impermeable to water, such as, for example, extruded polystyrene.

Of course, the presence of the block 302 has to be taken into account in determining the lengths of the first wall 104 and of the second wall 106.

FIG. 4 shows an electromagnetic wave diffraction device 500 according to the invention which is based on the diffraction devices 100 and 300.

On FIG. 4, the diffraction device 500 comprises protection means or a protection arrangement intended to reinforce the protection of the face of the second wall 106 which is oriented outward, that is to say on the other side of the second wall 106 relative to the outer face 12, against weather attack. This face is called the attacked face.

The protection means or protection arrangement thus reinforces the protection of the capacitive area generated in the space between the outer face 12 and the second wall 106.

Of course, the presence of the protection means or protection arrangement must be taken into account in determining the lengths of the first wall 104 and of the second wall 106.

In the case of FIG. 4, the protection means or protection arrangement takes the form of a panel 502 fixed to the outer face 12 and covering the plurality of resonant elements 102. The panel 502 is produced with a dielectric material that is impermeable to water.

The securing of the panel 502 is here assured by the installation of spacers 504 which here take the form of C-shaped profiles, and which are fixed between the outer face 12 and the panel 502. Each spacer 504 is placed alongside a first wall 104.

The spacers 504 can be produced in a dielectric material or an electrically conductive material.

In the case where the visibility through the panel 502 has to be assured, for example when there is a window, at least a part of the panel 502, in particular the part facing the window, and more particularly all the panel 502, is chosen so as to be transparent in the visible spectrum.

Similarly, if the visibility through a resonant element 102, the protection means, a block 302 has to be assured, each of these elements is chosen so as to be transparent in the visible spectrum, in particular between 400 nm and 700 nm.

In the case of FIG. 5, the wall 10 is an electrically conductive additional wall fixed onto the outer façade of an outer wall 60 of a building by any appropriate means, for example when said outer wall 60 is not electrically conductive or when its surface condition is granular.

FIG. 5 thus shows an equipped wall 700 according to the invention, which comprises the electrically conductive additional wall 10 onto the outer face 12 of which the resonant elements 102 are fixed.

When the building has windows 62, at least a part of the additional wall 10 is transparent in the visible spectrum, in particular the parts of the additional wall 10 which are facing the windows 62.

Figure 6:
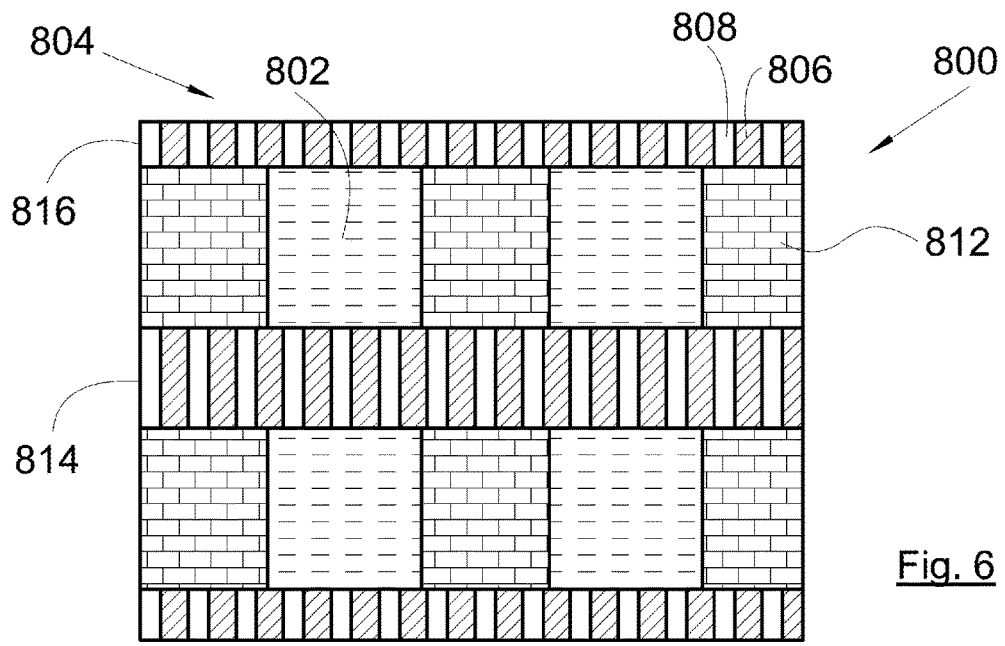
FIG. 6 is a view of a part of a building according to a particular embodiment of the invention.

FIG. 6 shows a part 800 of the outer face 812 of an outer wall of a building which comprises apertures 802 (here 4 of them). The apertures 802 are arranged horizontally to one another. There is thus defined, on the outer face 812 below each horizontal alignment of apertures 802, a lower surface 814 and, above each horizontal alignment of apertures 802, an upper surface 816.

Of course, when there are apertures arranged vertically to one another, the lower surface 814 of a horizontal alignment becomes the upper surface of the horizontal alignment just below.

A diffraction device 804 is fixed to each lower surface 814 and to each upper surface 816.

Each diffraction device 804 conforms to this described previously under the reference 500 and each resonant element extends vertically, and in FIG. 6, each diffraction device 804 takes the form of a diffraction device 100.

Each shaded part 806 constitutes a second wall 806 and each non-shaded part 808 constitutes a space between two consecutive diffraction devices 804.

Each part of the outer face 812 which is not covered by the diffraction devices 804 or pierced with openings 802 is covered with a coating absorbing the radar waves (radar absorbent material RAM), such as materials consisting of foams filled with carbon and ceramics.

Figure 7:
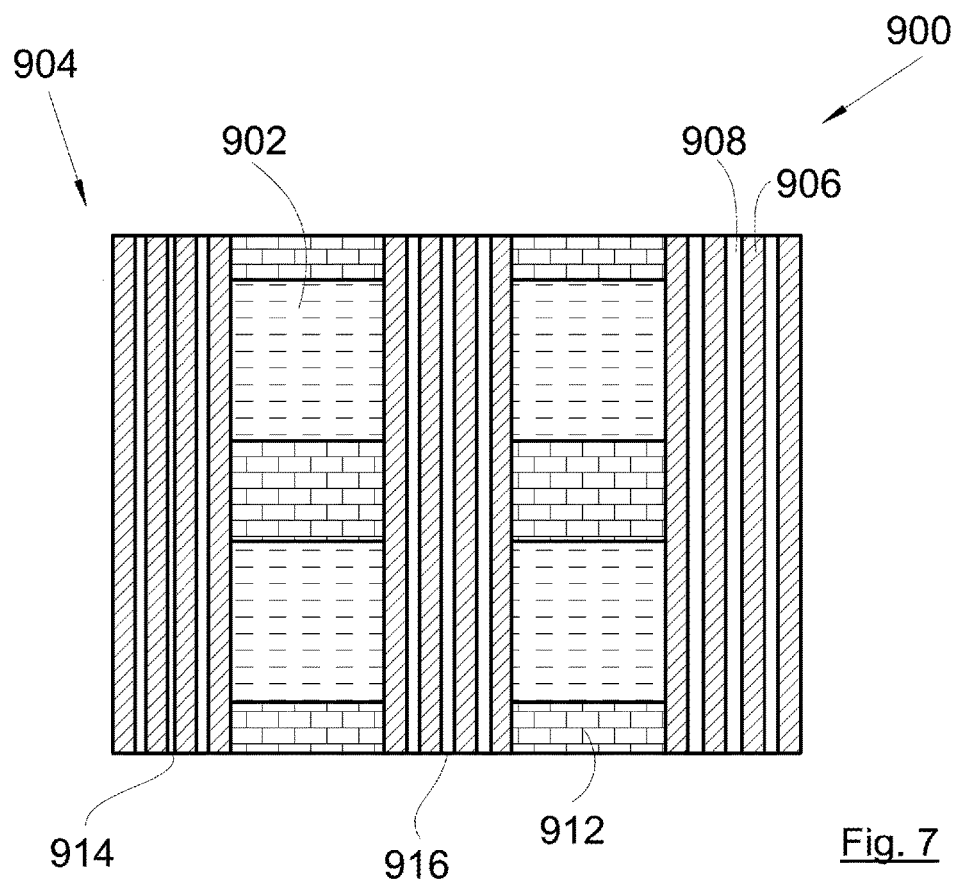
FIG. 7 is a view of a part of a building according to another particular embodiment of the invention.

FIG. 7 shows a part 900 of the outer face 912 of an outer wall of a building which comprises apertures 902 (here 4 of them). The apertures 902 are arranged vertically to one another. There is thus defined, on the outer face 912 to the left of each vertical alignment of apertures 902, a left lateral surface 914 and, to the right of each vertical alignment of apertures 902, a right lateral surface 916.

Of course, when there are apertures arranged horizontally alongside one another, the left lateral surface 914 of a vertical alignment becomes the right lateral surface of the vertical alignment just to the right.

A diffraction device 904 is fixed to each left lateral surface 914 and to each right lateral surface 916.

Each diffraction device 904 conforms to this described previously under the reference 500 and each resonant element extends vertically, and in FIG. 7, each diffraction device 904 takes the form of a diffraction device 100.

Each shaded part 906 constitutes a second wall 106 and each non-shaded part 908 constitutes a space between two consecutive diffraction devices 904.

Each part of the outer face 912 which is not covered by the diffraction devices 904 or pierced with the apertures 902 is covered with a coating absorbing the radar waves (radar absorbent material RAM), such as materials consisting of foams filled with carbon and ceramics.

While at least one exemplary embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

The invention claimed is:

1. An electromagnetic wave diffraction device intended to be fixed onto an outer face of an electrically conductive wall, the diffraction device comprising:
   a plurality of resonant elements in the form of an L-shaped profile which are electrically conductive and fixed parallel on the outer face,
   each resonant element comprising a first wall and a second wall secured at right angles to one another along a common edge, the first wall being intended to be fixed at right angles to the outer face by a fixing edge parallel to the common edge, whereas the edge of the second wall which is parallel to the common edge constitutes a free edge, and where the free edges of all the resonant elements are parallel and arranged on the same side relative to the common edge of the corresponding resonant element such that the plurality of resonant elements define continuous gaps between the first walls of adjacent resonant elements, and
   a protection arrangement configured to reinforce the protection of a capacitive area generated in a space between the outer face and the second wall, against weather attack, and taking the form of a panel produced with a dielectric material that is impermeable to water, fixed to the outer face and covering the plurality of resonant elements.

2. The diffraction device according to claim 1, wherein the length of the first wall and the length of the second wall are defined as a function of a wavelength and of an angle of incidence of an incident radiofrequency wave to be diffracted.

3. The diffraction device according to claim 1, wherein a block produced with a dielectric material that is impermeable to water is housed between the outer face and the second wall so as to fill the internal volume of the L-shaped resonant element.

4. The diffraction device according to claim 1, wherein at least a part of said panel is transparent in the visible spectrum.

5. The diffraction device according to claim 1, wherein the resonant elements are made of a material that is transparent in the visible spectrum.

6. A building comprising an electrically conductive outer wall having an outer face and an electromagnetic wave diffraction device according to claim 1, in which each resonant element is fixed onto said outer face.

7. An equipped wall comprising:
   an electrically conductive wall having an outer face and intended to be fixed onto an outer wall of a building, and
   an electromagnetic wave diffraction device according to claim 1, in which each resonant element is fixed onto said outer face.

8. An equipped wall according to claim 7, wherein at least a part of the wall is transparent in the visible spectrum.

9. A building comprising an outer wall and an equipped wall according to claim 7, in which said equipped wall is fixed onto the outer wall.

10. The diffraction device of claim 1, wherein each resonant element consists of the first wall and the second wall.

11. The diffraction device of claim 1, wherein the continuous gap between adjacent resonant elements is an open gap.

12. The diffraction device of claim 1, wherein a dielectric material is disposed within each continuous gap between adjacent resonant elements.

13. The diffraction device of claim 1, wherein a fixing edge is disposed within each continuous gap between adjacent resonant elements.

14. The diffraction device of claim 1, wherein the continuous gap between adjacent resonant elements is either an open gap or is partially filled with at least one of a dielectric material or a fixing edge.

15. A building comprising:
   an outer wall having an outer face and a plurality of apertures arranged horizontally to one another, thus defining, on the outer face below the horizontal alignment of apertures, a lower surface and, above the horizontal alignment of apertures, an upper surface,
   for each lower surface and each upper surface, a diffraction device fixed to each lower surface and to each upper surface such that at least a part of the outer face is not covered by the diffraction device or pierced with the apertures, wherein each diffraction device comprises:
      a plurality of resonant elements in the form of an L-shaped profile which are electrically conductive and fixed parallel on the outer face, each resonant element comprising a first wall and a second wall secured at right angles to one another along a common edge, the first wall being intended to be fixed at right angles to the outer face by a fixing edge parallel to the common edge, whereas the edge of the second wall which is parallel to the common edge constitutes a free edge, and where the free edges of all the resonant elements are parallel and arranged on the same side relative to the common edge of the corresponding resonant element, and
      a protection arrangement configured to reinforce the protection of a capacitive area generated in a space between the outer face and the second wall, against weather attack, and taking the form of a panel produced with a dielectric material that is impermeable to water, fixed to the outer face and covering the plurality of resonant elements,
   wherein each part of the outer face which is not covered by the diffraction devices or pierced with the apertures is covered with a coating absorbing electromagnetic waves.

16. A building comprising:
   an outer wall having an outer face and a plurality of apertures arranged vertically to one another, thus defining, on the outer face to the left of each vertical alignment of apertures, a left lateral surface and, to the right of each vertical alignment of apertures, a right lateral surface, for each left lateral surface and each right lateral surface, a diffraction device fixed to each left lateral surface and each right lateral surface such that at least a part of the outer face is not covered by the diffraction device or pierced with the apertures, wherein each diffraction device comprises:
- a plurality of resonant elements in the form of an L-shaped profile which are electrically conductive and fixed parallel on the outer face, each resonant element comprising a first wall and a second wall secured at right angles to one another along a common edge, the first wall being intended to be fixed at right angles to the outer face by a fixing edge parallel to the common edge, whereas the edge of the second wall which is parallel to the common edge constitutes a free edge, and where the free edges of all the resonant elements are parallel and arranged on the same side relative to the common edge of the corresponding resonant element, and
- a protection arrangement configured to reinforce the protection of a capacitive area generated in a space between the outer face and the second wall, against weather attack, and taking the form of a panel produced with a dielectric material that is impermeable to water, fixed to the outer face and covering the plurality of resonant elements, wherein each part of the outer face which is not covered by the diffraction devices or pierced with the apertures is covered with a coating absorbing electromagnetic waves.

* * * * *